United States Patent [19]

Nara et al.

[11] 3,904,783

[45] Sept. 9, 1975

[54] METHOD FOR FORMING A PRINTED CIRCUIT

[75] Inventors: Shigeo Nara; Kentaro Matsuyama, both of Mito, Japan

[73] Assignee: Nippon Telegraph and Telephone Public Corporation, Tokyo, Japan

[22] Filed: Mar. 20, 1974

[21] Appl. No.: 453,093

Related U.S. Application Data

[63] Continuation of Ser. No. 196,330, Nov. 8, 1971, abandoned.

[30] Foreign Application Priority Data

Nov. 11, 1970 Japan ............................... 45-98720

[52] U.S. Cl. .................... 427/54; 427/98; 427/306; 96/38.4; 96/48 PD; 96/27; 96/48; 96/38.4

[51] Int. Cl.[2] ........................ B44D 1/18; G03C 5/04

[58] Field of Search ....... 117/212, 93.3, 213; 96/48, 96/48 PD, 35.1, 38.4, 27

[56] References Cited

UNITED STATES PATENTS

| | | | |
|---|---|---|---|
| 3,227,553 | 1/1966 | Kyoto-shi | 96/27 |
| 3,492,151 | 1/1970 | Cescon | 117/93.3 X |
| 3,562,005 | 2/1971 | De Angelo et al. | 117/212 |
| 3,615,457 | 10/1971 | Seibert | 96/35.1 |
| 3,647,450 | 3/1972 | Calligaris et al. | 96/48 |
| 3,719,490 | 3/1973 | Yudelson | 96/48 PD |

OTHER PUBLICATIONS

Von Manekhaven, Table of Best Known Organic Salts of Silver, 1862.

Chemical Abstracts, Vol. 45, Col. 4168c.

*Primary Examiner*—John D. Welsh

*Attorney, Agent, or Firm*—Flynn & Frishauf

[57] ABSTRACT

A method for forming a printed circuit is disclosed. The method comprises coating the surface of an insulating substrate with a solution of metal salts of organic acids in a mixed solvent consisting of alcohol, water and ammonia to form a photosensitive layer consisting of said metal salts thereon, irradiating the desired portions of the layer with ultraviolet rays so as to deposit the metal on a pattern of a desired circuit, developing and fixing the deposited metal, and carrying out the plating on the pattern, whereby the deposited metal functions as the nuclei for the plating.

5 Claims, 5 Drawing Figures

METHOD FOR FORMING A PRINTED CIRCUIT

This is a continuation of application Ser. No. 196,330 filed Nov. 8, 1971, now abandoned.

This invention relates to a simple direct method for forming a printed circuit on the surface of an insulating substrate utilizing photochemical reaction.

Heretofore, printed circuit boards have been made by the so-called photoetching process which comprises forming a photoresist layer mainly comprising photosensitive resin on the surface of an laminated plate with a copper foil top, laying a negative of a desired circuit pattern thereon, exposing the layer covered by the negative to light, processing the photoresist layer to develop the pattern and to remove the unexposed portions, and etching the copper foil so as to remove the portions of the copper foil corresponding to the unexposed portions. This method involves extremely complicated steps such as through-hole plating which effect connection of the circuit patterns on both surfaces. Therefore, this method requires much time and process and incurs low yield and high cost. Also in this photoetching method, the material loss is great since most parts of the copper foil are removed by dissolution, only required circuit portions being left.

There is a new method disclosed in Japanese Pat. No. 284,180 known as the CC-4 Method, which has overcome the abovementioned disadvantage. This method comprises printing a circuit pattern on an insulating plate with a synthetic resin ink containing 1 – 10 percent by weight of fine metal powder by means of a silk screen, and carrying out electroless plating on the nuclei of the printed fine metal powder pattern.

The CC-4 Method is superior to the conventional photoetching method in that the step of removing the copper foil part which does not constitute the circuit pattern is not required and thus waste of the material is avoided and the number of steps decreases. In this method, however, preciseness of thin line patterns formed by silk screen printing is not satisfactory. So this method is not a quite adequate method, either.

This invention is an entirely new method for forming a printed circuit utilizing a photochemical reaction, which is intended to eliminate the above-explained disadvantages of the prior art methods.

The method of this invention comprises coating the surface of an insulating substrate with a solution prepared by dissolving a metal salt of an organic acid in a mixed solvent to form a photosensitive layer consisting of said metal salt thereon, irradiating the desired portions of said layer with ultraviolet rays so as to deposit the metal at the desired portions, developing and fixing the deposited metal and carrying out the plating utilizing the deposited metal as the plating nuclei. The metal salt of an organic acid can be used in combination with a binding material, too.

The method of this invention is advantageous in that: (1) Thin line patterns with excellent dimensional accuracy can be obtained by deposition of metal particles of molecular order by photochemical reaction; (2) Number of the steps for manufacturing printed circuit board is considerably lessened; (3) The printed circuit board is not manufactured from copper foil top laminated and therefore waste of copper foil is eliminated; (4) No complicated pre-treatment is required; (5) An ordinary electroless plating solution can be used; (6) Direct electroplating can be employed, too, if desired; (7) The binding material, if used, can be selected from a wide range of resin materials; (8) When through-hole plating is required, the plating of through holes can be carried out simultaneously with the plating of the plane surface circuits; (9) As the preferred wave length range to which the used metal salts of the organic acids are sensitive lies in the ultraviolet range around 250 m$\mu$, the materials can be safely handled under the visible light, therefore no optical restriction is necessary in the workshop; and further spectral sensitization by the use of dyes can be resorted to, too.

The present invention can be more fully understood from the following detailed description when taken in conjunction with reference to the appended drawings, in which.

Figure 4:
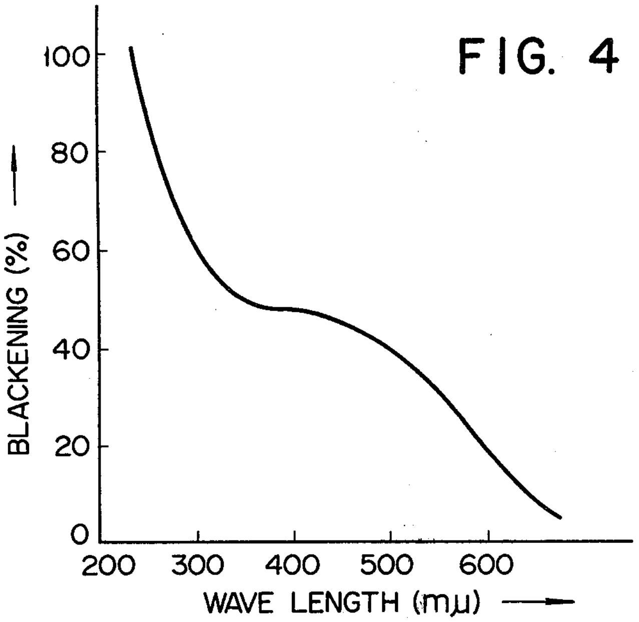
Figure 5:
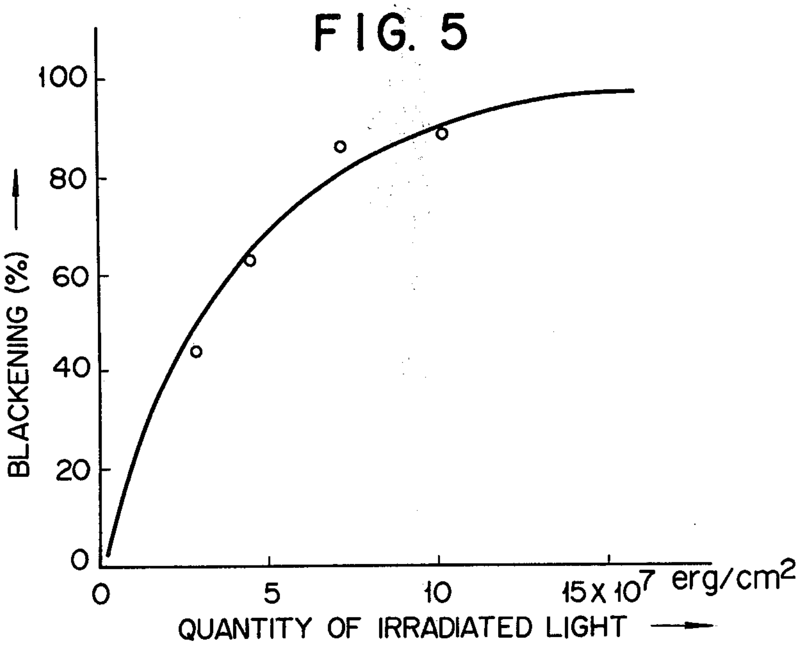

FIG. 4 is a diagram showing the relation between wave length of irradiating rays and the blackening of silver glutamate when silver glutamate is irradiated with rays of varied wave lengths (the quantity of irradiated light is constant value of $1.5 \times 10^8$ erg/cm$^2$); and FIG. 5 is a diagram showing the relation between the quantity of irradiated light and the blackening of silver glutamate when silver glutamate is irradiated with 251 m$\mu$ rays.

This invention is based on the fact that certain metal salts of the organic acids liberate metal ions when irradiated with ultraviolet rays, and the liberated metal ions turn to metal atoms as the result of oxidation, reduction reaction, and the thus formed metal atoms aggregate. The steps of the method of this invention is now explained with reference to FIG. 1. The surface of an insulating substrate 1, which has been roughened by conventional mechanical or chemical means, is coated with a photosensitive layer 2 comprising a metal salt of an organic acid. A circuit pattern negative 3 is laid in contact with the layer and the layer is irradiated with ultraviolet rays 4 through the negative, whereby metal atoms are deposited at the portions corresponding to the positive pattern, said deposited metal functioning as plating nuclei 5. The layer is developed and fixed and the metal salt of the organic acid which has not been exposed is removed, and thereafter, plating is carried out so as to form metallic layer 6 on the deposited metal 5. Thus a circuit pattern is directly formed on the insulating substrate.

The metal salt of the organic acid is selected from a wide range of low molecular and high molecular organic acid salts. As to the acid radical, layer-forming property and stability being considered, as a high molecular acid, polyacrylic acid, polymethacrylic acid, etc. and as a low molecular acid, glutamic acid, acrylic acid, methacrylic acid, alginic acid, pectic acid, etc. are preferred. As to the metal part of the organic acid salts, electrochemically noble metals such as silver, palladium, etc. are preferred, but it has been found from the study of decomposition rate and stability of metal salts and particle size of the deposited metal that metals such as copper, mercury, iron, etc. are preferable as well as the above-mentioned noble metals.

The metal salt of the organic acid can be applied to the substrate surface as a solution of a salt, in a mixed solvent as explained above, but a binder can be used in combination with the metal salt dissolved in a mixed solvent. In this case, selection of the binding materials is very important, whereby it is needles to say that strength of the resulting layer and bonding between the layer and the substrate surface, etc. must be carefully considered, and further dispersibility, compatibility and stability of the metal salt must be taken into consideration, since these factors affect preciseness of the circuit pattern. Generally, photosensitive resins such as epoxy resins and butyral resins or dichromategelatin mixture given good results. Also good results are obtained by using a system comprising a metal salt of a monomeric unsaturated organic acid such as monomeric acrylic acid or methacrylic acid, which photolytically liberates metal ions and unsaturated acid, the former aggregating and the latter photopolymerizing to give a hard binder. The employment of the above-mentioned binder is desirable because organic acids are liable to decomposition and deterioration in the presence of a strong alkaline solution such as the electroless plating solution of the ordinary type, and the binder prevents their decomposition and deterioration. Also the binder contributes to bonding between the photosensitive layer and the insulating substrate. However, if too large an amount of binder is used, it will retard deposition of metal, which means that it takes too much time before the plating is completed to the extent that satisfactory electroconductive pattern is formed. Good results are obtained when the ratio of the metal salt of the organic acid and the binder to be used is about 0.5 to 1.0 by weight.

Figure 2:
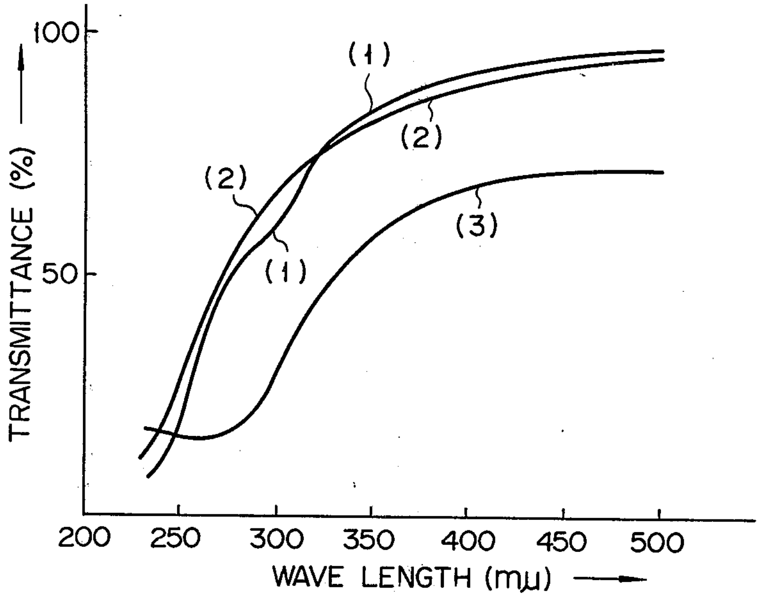
FIGS. 2 and 3 are diagrams showing the relations between wave length and transmittance of various metal salts of organic acids which are used in accordance with this invention.
Figure 3:
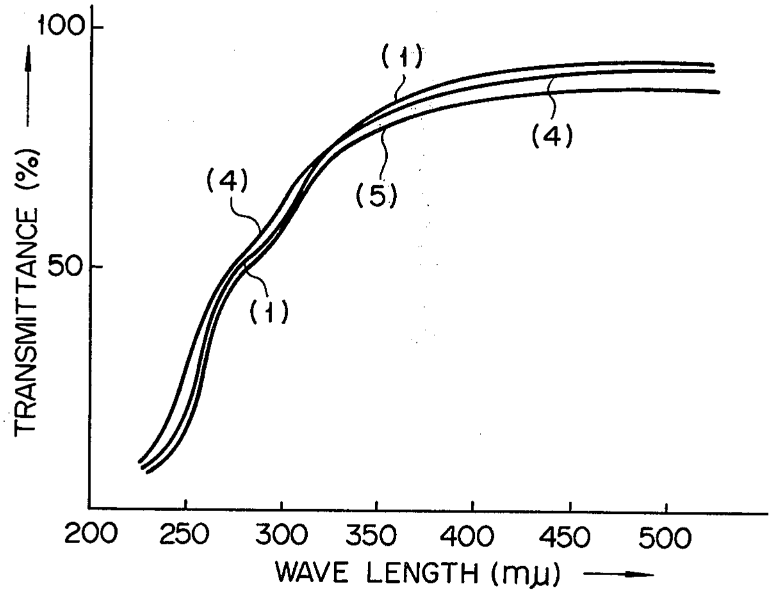

As to the ultraviolet rays to be employed, it is most desirable to use rays of the wave lengths which are best absorbed by the organic acid salt causing its decomposition. The UV-spectrums of various kinds of metal salts of organic acids are shown in FIGS. 2 and 3. Curves 1, 2 and 3 in FIG. 2 stand for respectively silver glutamate, palladium glutamate, and copper glutamate; and Curves 1, 4 and 5 in FIG. 3 stand for silver glutamate, silver acrylate and silver methacrylate respectively.

Further, the relation between wave length of irradiating rays and blackening of silver glutamate when the latter is irradiated with rays of various wave lengths (quantity of irradiated light $1.5 \times 10^8$ erg/cm$^2$) is shown in FIG. 4. The value of blackening (%) is determined by comparison with the blackening (set as 0%) when the substance is irradiated with the 630 m$\mu$ rays with the transmittance of 100%.

As will be apparent from FIGS. 2 and 3, when rays of wave lengths longer than 350 m$\mu$ are used, transmittance is great, which means that absorption of the rays is insufficient, and therefore, photolytic deposition of metal is poor.

This relation is reflected in the results represented by FIG. 4, too, wherein the employment of rays the wave length of which is longer than 350 m$\mu$ results in poor deposition of silver, that is, a low value of the blackening degree. Therefore, it is desirable to use ultraviolet rays the wave length of which is shorter than 350 m$\mu$. When a dye is used, the degree of blackening is increased by spectral sensitization even if rays the wave length of which is longer than 350 m$\mu$ are employed.

FIG. 5 shows a curve which represents the relation between quantity of irradiated light and blackening of silver glutamate when this substance is irradiated with the rays of wave length 251 m$\mu$. As will be apparent from this curve, when the quantity of irradiation is less than $8 \times 10^7$ erg/cm$^2$, the deposition of silver is poor, that is, blackening degree is low. Therefore, the method of this invention is preferably carried out with quantity of irradiation of $8 \times 10^7$ erg/cm$^2$ or more.

As the metal salts of the organic acids or said salts and binders are not easily soluble in a simple solvent, a mixed solvent is used for preparing solution of these materials. Examples of preferred solvents are alcohol-water-ammonia ternary system, alcohol-water-ethylene diamine ternary system, etc.

Figure 1:
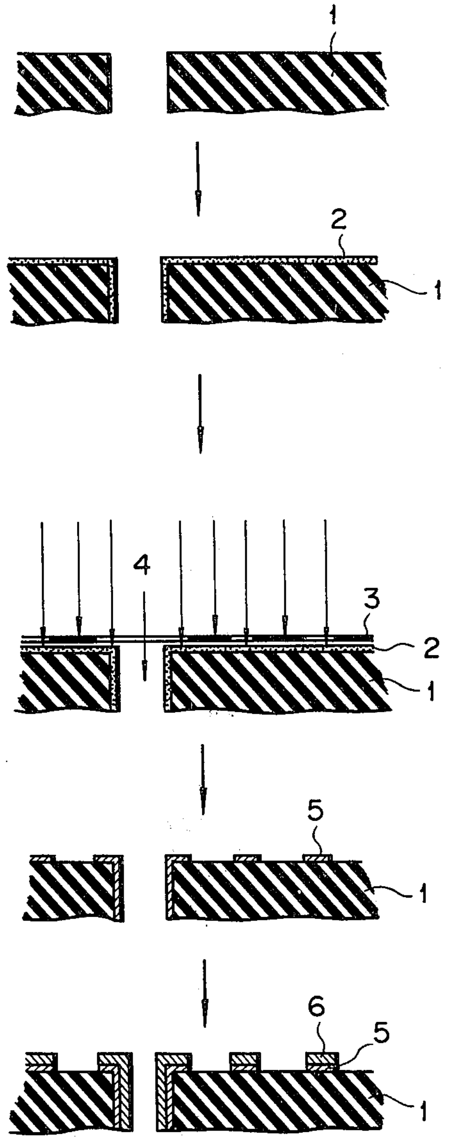
FIG. 1 illustrates the steps of the method for forming a printed circuit in accordance with this invention.

The plating nuclei of the circuit pattern shown as 5 in FIG. 1 comprises fine metal particles formed by photolysis upon exposure. But in unexposed portions, the metal salt of the organic acid may remain undecomposed. Such remaining metal salt of organic acid has a deleterious effect upon stability, insulating property, etc. of printed circuit plates. Also the organic acid may partly remain in the exposed portions after the metal has been liberated, which will abate the resistance to strongly alkaline plating solution, causing abatement in preciseness of the circuit pattern configuration, bond strength between the conductive circuit pattern material and the substrate. Therefore, it is necessary not only to remove the remaining metal salt of organic acid in the unexposed portions by development and fixation treatment, but also to dissolve the residual organic acid in the exposed region leaving deposited metal on the substrate. For this purpose, various solutions can be used according to species of organic acid and metal. Generally, a solution of water or an alcoholic solvent, which is a good solvent for organic acids, mixed with ammonia water and sodium hydroxide gives good results. The formation of this line patterns is performed in good yield and stability by the above-mentioned developing and fixing processing.

It will be needless to say that the method of this invention can be carried out by not only contact printing with a negative, but also by means of the numerical-controlled light beam plotter which directly draws circuit patterns by light beam on the photosensitive layer.

Also it will be readily understood that various materials including synthetic resin plates, synthetic flexible films and ceramic plates, etc. can be used for the insulating substrate.

Now the invention is illustrated by way of working examples.

EXAMPLE 1

To an aqueous solution of glutamic acid, sodium hydroxide was added so as to form sodium glutamate. The salt was precipitated with methanol, collected by filtration and was dissolved in water. To the thus obtained aqueous solution of sodium glutamate, an aqueous silver nitrate solution was added so as to give silver glutamate. One gram (1g) of the thus obtained silver glutamate was dissolved in 20 ml of an ethanol-water (50:50) mixture containing 1 ml of ammonia water.

This solution was applied to an epoxy resin laminate plate so as to form a layer several microns in thickness by means of a roller-coater, and was dried for a few minutes at 60°– 80°C. Upon this plate was laid a circuit pattern negative. The thinnest line in the pattern was 0.2 mm in width, and the smallest space between the conductive portions was 0.2 mm. The layer was exposed to ultraviolet rays of 251 m$\mu$ wave length from a high pressure mercury lamp through the negative for 10 – 15 minutes (quantity of irradiation $1.5 \times 10^8$ erg/cm$^2$).

After the irradiation was finished, the plate was immersed in an ammoniacal sodium hydroxide solution (20 ml ammonia water and 30 – 40 g sodium hydroxide in 1 liter water), and the solution was agitated well so as to dissolve the silver glutamate remaining in the unexposed region, as well as glutamic acid left in the exposed region. Thus the circuit pattern comprised of a small amount of fine silver particles deposited on the exposed region appeared after the above-mentioned development and fixation treatment.

The plate having the silver particle pattern was then immersed in an ordinary electroless plating solution (PH is more than 11), comprising 14.6 g copper sulfate ($CuSO_4.5H_2O$), 7.5 g sodium hydroxide, 7.5 g Rochelle salt and 43.8 g 37 % aqueous formaldehyde solution in water to make 1 liter, without employing any activating pre-treatment. In 15 – 20 minutes, a copper circuit pattern 1 – 2 $\mu$ in thickness was formed. The same result was obtained when copper glutamate was used in lieu of silver glutamate.

EXAMPLE 2

Starting from a solution of polyacrylic acid, which was synthesized in an aqueous solution using a redox catalyst, poly silver acrylate was prepared in the same way as explained in Example 1 with respect to silver acrylate. Two grams (2g) of the thus obtained poly silver acrylate was dissolved in the mixed solvent and was applied to a epoxy resin plate and was dried so as to form a photosensitive layer as in Example 1.

A printed circuit plate was obtained by exposing the layer to ultraviolet rays through a contacting negative, developing and fixing the pattern, and carrying out the electroless copper plating as in Example 1.

EXAMPLE 3

Palladium glutamate was synthesised in the same way as explained in Example 1 with respect to silver glutamate. Two grams (2g) of the palladium glutamate was dissolved in the mixed solvent, the solution was applied onto an epoxy resin plate and was dried in the same way as in Example 1. The exposing, development and fixation and electroless copper plating were carried out as in Example 1 and a conductive circuit pattern was formed.

EXAMPLE 4

Started with 2 g of poly silver acrylate, preparation of the solution, coating of an epoxy resin plate, drying, exposure, development and fixation, and electroless copper plating were carried out in the same way as in Example 1, and a conductive circuit pattern was formed.

EXAMPLE 5

One gram (1g) of silver glutamate was dissolved in the mixed solvent as in Example 1, and the solution was applied to an epoxy resin plate having a plurality of through holes 1 – 2 mm in diameter prepared by drilling and was dried as in Example 1. Care was taken so that the inside walls of the through holes were coated. Using a circuit pattern negative, exposing was carried out with special care so that the inside walls were irradiated with the ultraviolet rays. Development and fixation and electroless copper plating were carried out as in Example 1, and the inside walls of the holes were well plated to form a conductive surface as well as plane surfaces.

EXAMPLE 6

Example 1 was repeated except that eosine, an acid dye, or methylene blue, a basic dye, was added to the silver glutamate solution. By the addition of the dye, the photosensitive layer could be made sensitive to long wave ultraviolet rays such as emitted from an ultra high pressure mercury lamp. And the development and fixation and electroless copper plating as in Example 1 gave a conductive circuit pattern.

This example shows that the silver salt of the organic acid which is sensitive to short wave ultraviolet rays of 250 – 350 m$\mu$ was spectrally sensitized by the use of dyes.

Also it was found that when a small amount of sodium thiosulfate was added to the silver glutamate solution, exposure time was shortened by about 30 %. This is due to chemical sensitization in which the thiosulfate acts as a catalyst in the reaction of the metal salt of the organic acid by photolytic reduction.

EXAMPLE 7

A photosensitive solution was prepared by mixing a solution of the silver glutamate in ammoniacal ethanol as given in Example 1 and the equal amount of a solution prepared by adding to a gelatin solution (1 part gelatin in 8 parts water) ammonium dichromate (0.8 % by weight of gelatin). The mixture of gelatin solution and ammonium dichormate is a binder. The thus obtained solution was applied to an epoxy resin plate, dried, exposed, developed and fixed in the same way as in Example 1. The developed and fixed pattern was electrolessly copper-plated, and a conductive circuit was formed.

EXAMPLE 8

One gram (1g) of silver glutamate and 1 g of epoxy resin as the binder were dissolved in the mixed solvent described in Example 1. Further a small amount of a cold setting type hardener for the epoxy resin, diethylene triamine, for instance, was added to the solution. This solution was applied to the surface of an epoxy resin laminate plate by a roller-coater so as to form a layer 30 – 50 $\mu$ in thickness and was dried and hardened. The layer was exposed to a high pressure mercury lamp as explained in Example 1 for 30 minutes through a circuit pattern negative (the smallest width of the conductive passage 0.2 mm and smallest intercircuit space 0.2 mm) which was laid on the layer surface. The treated plate was treated with a solution consisting of 20 ml ammonia water, 20 g sodium hydroxide and 1 liter ethanol for development and fixation. The plate was immersed in an electroless copper plating solution as in Example 1 for 20 minutes without employing any activating pretreatment. A conductive circuit pattern was formed.

EXAMPLE 9

A solution containing poly silver acrylate, epoxy resin and a small amount of the hardener in the ammoniacal ethanol was applied to the surface of an epoxy resin laminate plate, and dried to form a photosensitive layer in the same way as in Example 8. The layer was exposed, developed and fixed, and the developed and fixed pattern was electrolessly copper-plated in the same way. Thus a conductive circuit pattern was formed.

EXAMPLE 10

A photosensitive solution was prepared by dissolving poly palladium acrylate in the ammoniacal ethanol mixed solvent as given in Example 8 and adding epoxy resin and a hardener such as diethylene triamine. The solution was applied to an epoxy resin laminate plate, dried and hardened in the same way as in Example 8. The layer was exposed to a high pressure mercury lamp through a circuit pattern negative, developed and fixed as explained in Example 8. The developed and fixed pattern was electrolessly copper-plated under the same conditions as Example 1. A conductive circuit pattern was formed.

EXAMPLE 11

A photosensitive solution was prepared by dissolving silver salts of acrylic acid and methacrylic acid in the ammoniacal ethanol solution, adding a small amount of N,N'-methylene-bis-acrylamide as a cross-linking agent and benzophenone as a photopolymerization catalyst. The solution was applied to an epoxy resin laminate plate and dried to form a photosensitive layer. The layer was exposed in the same way as in Example 1. When exposed, silver was photolytically deposited and aggregated, at the same time acylic acid and methacrylic acid photochemically polymerize and the formed polymer was further three dimensionally cross-linked with the N,N'-methylene-bis-acrylamide. The unexposed portions of the layer were removed by dissolution and washed, and the developed and fixed pattern electrolessly copper-plated as in Example 8, and a conductive circuit pattern was formed.

EXAMPLE 12

The photosensitive solution of Example 7 was applied to an epoxy resin laminate plate having a plurality of through holes prepared by drilling. The plate was rotated by a spinner so that the applied solution uniformly spread to the inside walls of the through holes. The coated plate was exposed so as to deposit silver plating nuclei, processed for development and fixation, electrolessly copper-plated as in Example 7, and a conductive circuit pattern was obtained. The inside walls of the through holes were well plated as well as the plane surfaces.

What we claim is:

1. In the method of forming a printed circuit by coating a metal organic salt on an insulating substrate, activating said metal salt by ultraviolet rays so as to deposit a metal on the insulating substrate and subsequently electrolessly metallizing thereon, the improvement which comprises coating the surface of the insulating substrate with a solution of silver glutamate in a mixed solvent selected from the group consisting of an alcohol-water-ammonia mixture and an alcohol-water-ethylene diamine mixture, to form a photosensitive layer of said silver glutamate thereon; irradiating the desired portions of said layer with ultraviolet rays having a wave length shorter than 350mμ and in a quantity of irradiated light of at least $8 \times 10^7$ erg/cm$^2$ so as to deposit silver metal at the desired portions; removing the non-irradiated silver glutamate and organic acid liberated by irradiation; and carrying out the electroless plating utilizing the deposited silver as the plating nuclei.

2. A method as claimed in claim 1, wherein the photosensitive layer contains a binding material.

3. A method as claimed in claim 2, wherein removal of non-irradiated silver glutamate and liberated glutamic acid are carried out by using said mixed solvent.

4. A method as claimed in claim 2, wherein the binding material is selected from the group consisting of epoxy resin and dichromate-gelatin mixture.

5. A method as claimed in claim 1, wherein removal of non-irradiated silver glutamate and liberated glutamic acid are carried out by using said mixed solvent.

* * * * *